(12) United States Patent
Huang et al.

(10) Patent No.: US 8,643,422 B1
(45) Date of Patent: Feb. 4, 2014

(54) SLICER AND METHOD OF OPERATING THE SAME

(75) Inventors: Ming-Chieh Huang, San Jose, CA (US);
Chan-Hong Chern, Palo Alto, CA (US);
Tao Wen Chung, San Jose, CA (US);
Chih-Chang Lin, San Jose, CA (US);
Tsung-Ching Huang, San Jose, CA (US); Derek C. Tao, Fremont, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 18 days.

(21) Appl. No.: 13/547,396

(22) Filed: Jul. 12, 2012

(51) Int. Cl.
*H03K 3/356* (2006.01)

(52) U.S. Cl.
USPC ............ 327/213; 327/208; 327/212; 327/218

(58) Field of Classification Search
USPC .................. 327/199, 208–214, 218; 375/233, 375/316–318
See application file for complete search history.

(56) References Cited

U.S. PATENT DOCUMENTS

| 8,477,833 | B2 * | 7/2013 | Bulzacchelli et al. | ........ 375/233 |
|---|---|---|---|---|
| 2004/0027185 | A1 * | 2/2004 | Fiedler | ............................ 327/211 |
| 2012/0038390 | A1 * | 2/2012 | Raghavan | ........................ 327/94 |

* cited by examiner

*Primary Examiner* — Patrick O'Neill
(74) *Attorney, Agent, or Firm* — Lowe Hauptman & Ham, LLP

(57) ABSTRACT

This description relates to a slicer including a first latch. The first latch includes an evaluating transistor configured to receive a first clock signal and a developing transistor configured to receive a second clock signal. The first clock signal is different from the second clock signal. The first latch includes first and second input transistors configured to receive first and second complementary inputs. The first latch includes at least one pre-charging transistor configured to receive a third clock signal. The first latch further at least one cross-latched pair of transistors, the at least one cross-latched transistor pair connected between the evaluating transistor and the first and second output nodes. The slicer includes a second latch connected to the first and second output nodes and to a third output node. The slicer includes a buffer connected to the third output node and configured to generate a final output signal.

20 Claims, 6 Drawing Sheets

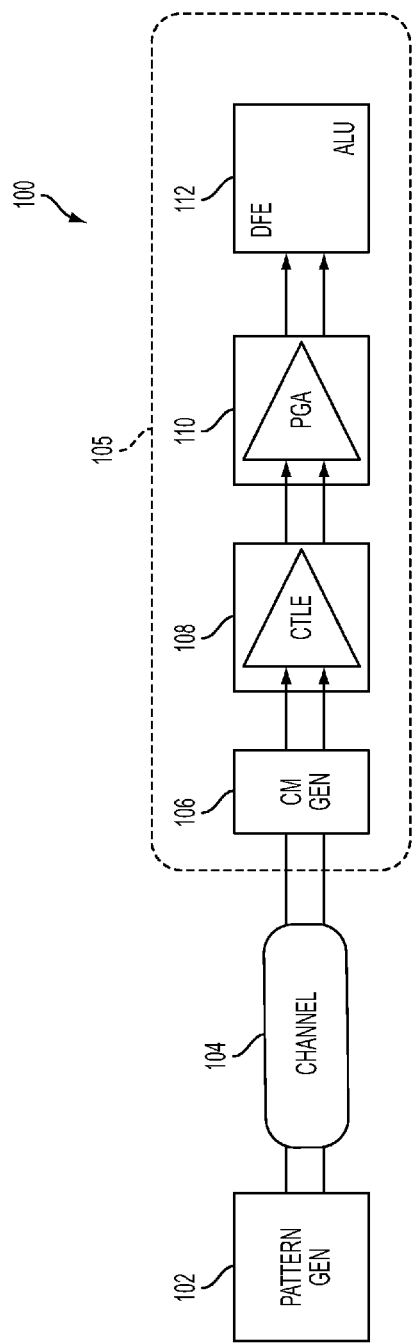
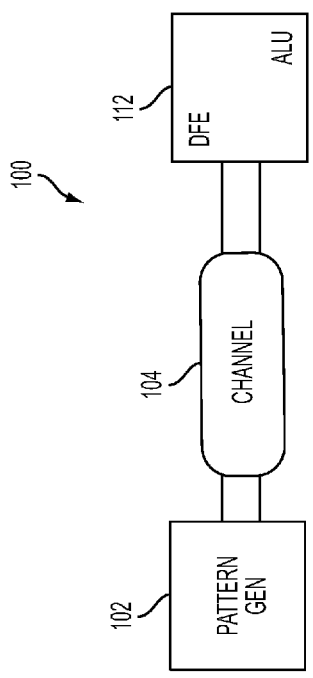

SLICER AND METHOD OF OPERATING THE SAME

BACKGROUND

In a signal transmission system, a channel through which a signal travels between a transmitter and a receiver causes the signal to degrade. For example, in a pulse signal highs and lows of the signal become less sharply defined which causes a first symbol to interfere with other symbols before and after the first symbol. In order to output a more precise signal, a decision feedback equalizer is used to reduce the interference generated by the first symbol from other symbols which follow the first symbol. Depending on the quality of the signal received by the receiver, the first symbol may also interfere with symbols separated from the first symbol by one or more intervening symbols. The process continues in an iterative fashion to produce a high quality symbol output.

As technology nodes decrease and a speed of processing increases, a rate at which symbols in the signal are identified acts as a limit on the speed at which information can be transmitted along the channel. In some instances, a minimum amount of time necessary for the feedback equalizer to identify a symbol, i.e., the minimum identification time, is approximately 75 picoseconds (ps). The minimum identification time corresponds to a maximum transmission rate of approximately 5 gigahertz (GHz). When the speed of transmission increases above approximately 5 GHz, the decision feedback equalizer cannot identify the first symbol during a single rise and fall of an evaluation clock signal. In some instances, a decision feedback equalizer having a half rate architecture is used to facilitate identification of the first symbol and later symbols. The half rate architecture de-multiplexes the signal into two separate signals effectively separating the signal into two halves to reduce signal degradation during propagation through the channel. The half rate architecture is complex and increases the size of the circuit used to analyze the signal.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

FIG. 1A is a block diagram of a signal transmission system in accordance with one or more embodiments;

FIG. 1B is a block diagram of a signal transmission system in accordance with one or more embodiments;

DETAILED DESCRIPTION

Figure 2A:
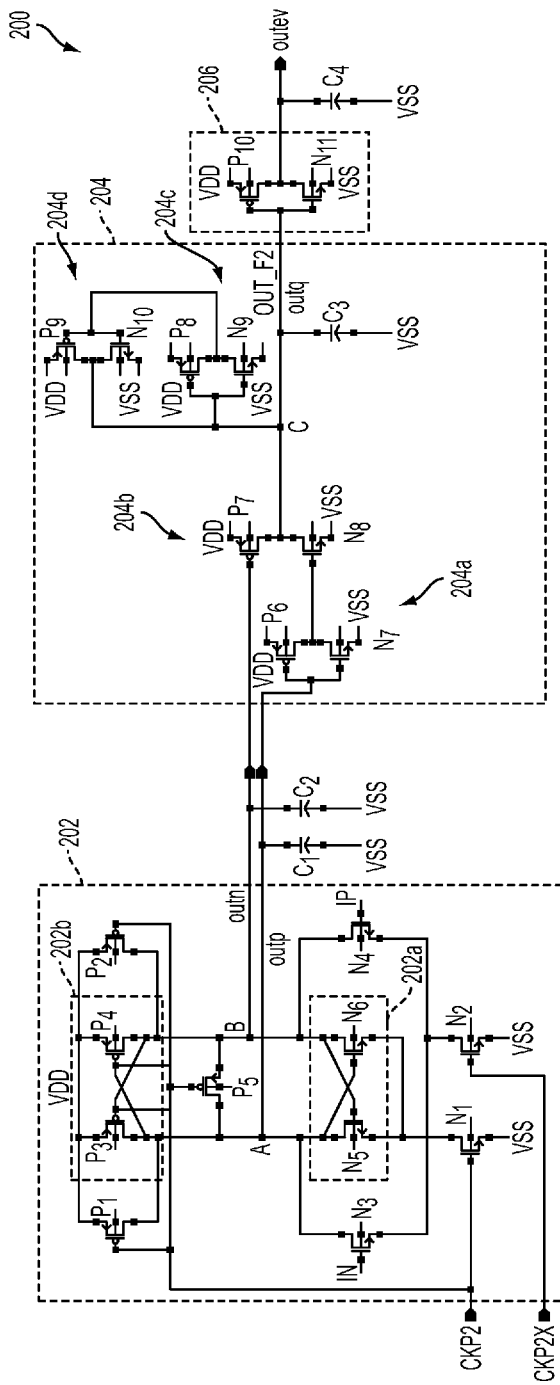
FIG. 2A is a schematic diagram of a slicer in accordance with one or more embodiments.

The following disclosure provides many different embodiments, or examples, for implementing different features of the invention. Specific examples of components and arrangements are described below to simplify the present disclosure. These are examples and are not intended to be limiting.

FIG. 1A is a block diagram of a signal transmission system 100 according to at least one embodiment. Signal transmission system 100 includes a pattern generator 102 configured to generate a signal to be transmitted. Signal transmission system 100 also includes a channel 104 configured to allow the signal to propagate from pattern generator 102 to a receiver 105. In some embodiments, channel 104 is a fiber optical cable, a coaxial cable, or other suitable propagating medium. In some embodiments, channel 104 is air and the signal is a wireless signal.

Signal transmission system 100 optionally includes a common mode generator 106 configured to generate a component of an analog signal having a same sign on both signal leads. An optional continuous time linear equalizer 108 is configured to receive an output from common mode generator 106. Continuous time linear equalizer 108 is configured to attenuate low frequency components of the output from common mode generator 106 to provide an output signal having greater coherency than an input signal. An output of continuous time linear equalizer 108 is transmitted to an optional programmable gain amplifier 110 configured to amplify the signal to facilitate distinction between individual symbols within the signal.

Decision feedback equalizer 112 is configured to receive an output of programmable gain amplifier 110 and identify the individual symbols of the signal. In the embodiments of FIG. 1B, decision feedback equalizer 112 is configured to receive the signal directly from channel 104. In some embodiments, CTLE 108 is configured to receive the signal directly from channel 104 and decision feedback equalizer 112 is configured to receive an output directly from CTLE 108.

During propagation through channel 104, a contrast of the signal is reduced such that waves of the signal are less sharply defined than at an output of pattern generator 102 and the waves begin to overlap with one another. This overlap is called inter-symbol interference (ISI). Decision feedback equalizer 112 is configured to reduce ISI and identify the individual symbols by comparing a determined value of an identified symbol with a portion of the signal associated with a subsequent symbol in order to minimize an interference of the identified symbol in determining a value of the subsequent symbol. In order to separate the symbols from one another, decision feedback equalizer 112 uses a slicer. The slicer is configured to clip portions of the signal which are above or below a predetermined voltage level. By clipping portions of the signal relative to the predetermined voltage, the slicer is able to remove portions of signal noise between consecutive symbols generated during transmission through channel 104.

To increase a speed of data transfer, a time between symbols is reduced resulting in higher frequency signals. Higher frequency signals experience a greater degree of distortion when propagating through channel 104. In order to be effective, the slicer must identify a symbol within a single rise and fall of a clock signal set to the same frequency as the signal. As the frequency increases, the duration between the rise of the clock signal to a high voltage level and fall of the clock signal to a low voltage level decreases. Thus, in order to increase the speed of data transfer, the speed of the slicer must also increase.

FIG. 2A is a schematic diagram of a slicer 200. Slicer 200 includes a first latch 202 configured to receive two input signals IN and IP. Slicer 200 further includes a second latch 204 configured to prevent improper identification of a symbol during a pre-charge period of first latch 202. Slicer 200 further includes a buffer 206 configured to output an evaluation of the symbol based on the two input signals.

Figure 2B:
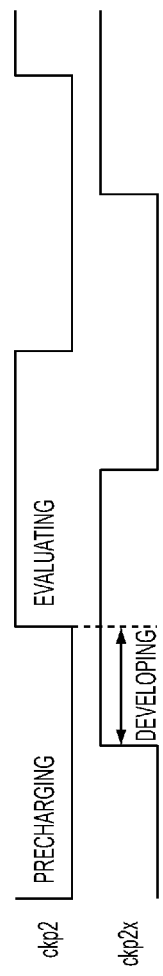
FIG. 2B is a waveform diagram of clock signals for use in the slicer of FIG. 2A in accordance with one or more embodiments.

First latch 202 is configured to receive a first clock signal ckp2 and a second clock signal ckp2x. FIG. 2B is a waveform diagram of first and second clock signals ckp2 and ckp2x for slicer 200. First and second clock signals ckp2 and ckp2x have the same period. First clock signal ckp2 is delayed a predetermined time period with respect to second clock signal ckp2x such that the first and second clock signals overlap with one another. In some embodiments, the predetermined time period is about 5 picoseconds (ps) to about 25 ps. As the predetermined time period increases, power consumption increases but a time necessary for symbol evaluation decreases.

First latch 202 includes an evaluation transistor N1. In the depicted embodiment, evaluation transistor N1 is an n-type metal-oxide-semiconductor (NMOS) transistor. In some embodiments, evaluation transistor N1 is a p-type metal-oxide-semiconductor (PMOS) transistor. The gate of evaluation transistor N1 is configured to receive first clock signal ckp2. The source of evaluation transistor N1 is configured to connect to a voltage source source (VSS). In some embodiments, voltage VSS is equivalent to ground. In some embodiments, voltage VSS is set to a reference voltage other than ground. In some embodiments, the reference voltage is a negative voltage.

First latch 202 includes a develop transistor N2. In the depicted embodiment, develop transistor N2 is an NMOS transistor. In some embodiments, develop transistor N2 is a PMOS transistor. The gate of develop transistor N2 is configured to receive second clock signal ckp2x. The source of develop transistor N2 is configured to connect to VSS.

First latch 202 includes a first input transistor N3 and a second input transistor N4. In the depicted embodiment, first input transistor N3 and second input transistor N4 are NMOS transistors. In some embodiments, first input transistor N3 and second input transistor N4 are PMOS transistors. The source of first and second input transistors N3 and N4 are connected to the drain of develop transistor N2. The gate of first input transistor N3 is configured to receive input IN. The gate of second input transistor N4 is configured to receive input IP.

First latch 202 further includes a first pre-charge transistor P1 and a second pre-charge transistor P2. In the depicted embodiment, first pre-charge transistor P1 and second pre-charge transistor P2 are PMOS transistors. In some embodiments, first pre-charge transistor P1 and second pre-charge transistor P2 are NMOS transistors. The gates of first pre-charge transistor P1 and second pre-charge transistor P2 are configured to receive first clock signal ckp2. The sources of first pre-charge transistor P1 and second pre-charge transistor P2 are configured to connect to a voltage drain drain (VDD).

First latch 202 also includes cross-latched transistors. In the depicted embodiment, first latch 202 includes two pairs of cross-latched transistors 202a and 202b. In some embodiments, first latch 202 includes a single pair of cross-latched transistors. In some embodiments, first latch 202 includes more than two pairs of cross-latched transistors.

The first pair of cross-latched transistors 202a includes a first cross-latched transistor N5 and a second cross-latched transistor N6. In the depicted embodiment, first cross-latched transistor N5 and second cross-latched transistor N6 are NMOS transistors. In some embodiments, first cross-latched transistor N5 and second cross-latched transistor N6 are PMOS transistors. The sources of first cross-latched transistor N5 and second cross-latched transistor N6 are connected to the drain of evaluation transistor N1. The drain of first cross-latched transistor N5 is connected to the gate of second cross-latched transistor N6 and to the drain of first input transistor N3. The drain of second cross-latched transistor N6 is connected to the gate of first cross-latched transistor N5 and to the drain of second input transistor N4.

The second pair of cross-latched transistors 202b includes a third cross-latched transistor P3 and a fourth cross-latched transistor P4. In the depicted embodiment, third cross-latched transistor P3 and fourth cross-latched transistor P4 are PMOS transistors. In some embodiments, third cross-latched transistor P3 and fourth cross-latched transistor P4 are NMOS transistors. The sources of third cross-latched transistor P3 and fourth cross-latched transistor P4 are configured to connect to VDD. The drain of third cross-latched transistor P3 is connected to the gate of fourth cross-latched transistor P4 and the drain of first pre-charge transistor P1. The drain of third cross-latched transistor P3 is also connected to the drain of first cross-latched transistor N5. The drain of fourth cross-latched transistor P4 is connected to the gate of third cross-latched transistor P3 and the drain of second pre-charge transistor P2. The drain of fourth cross-latched transistor P4 is also connected to the drain of second cross-latched transistor N6.

In some embodiments, a driving capability of first and second input transistors N3 and N4 is greater than that of each cross-latched transistor N5, N6, P3 or P4.

First latch 202 also includes a terminal connecting transistor P5. In the depicted embodiment, terminal connecting transistor P5 is a PMOS transistor. In some embodiments, terminal connecting transistor P5 is an NMOS transistor. The gate of terminal connecting transistor P5 is configured to receive clock ckp2. The source of terminal connecting transistor P5 is connected to the drain of first cross-latched transistor N5 and third cross-latched transistor P3. The drain of terminal connecting transistor P5 is connected to the drain of second cross-latched transistor N6 and fourth cross-latched transistor P4. Transistor P5 is configured to improve the accuracy of slicer 200 by electrically connecting a first output node A and a second output node B, so that a voltage level at the first output node is the same as the second output node. In some embodiments, terminal connecting transistor P5 is omitted from first latch 202.

First latch 202 is configured to output a first output signal outp from first output node A located at the drains of first cross-latched transistor N5 and third cross-latched transistor P3. First latch 202 is configured to output a second output signal outn from second output node B located at the drains of second cross-latched transistor N6 and fourth cross-latched transistor P4.

Second latch 204 is configured to receive first output signal outp and second output signal outn. A first capacitor C1 is connected to first output signal outp between first latch 202 and second latch 204. A first side of first capacitor C1 is connected to first output outp and a second side of the first capacitor is connected to VSS. A second capacitor C2 is connected to second output signal outn between first latch 202 and second latch 204. A first side of second capacitor C2 is connected to second output signal outn and a second side of the second capacitor is connected to VSS. During operation, first and second capacitors C1 and C2 are charged by first and second output signals outp and outn, respectively Second latch 204 includes a first inverter 204a including an NMOS transistor N7 and a PMOS transistor P6. The gates of NMOS transistor N7 and PMOS transistor P6 are configured to receive first output signal outp. The drains of NMOS transistor N7 and PMOS transistor P6 are connected to each other. The source of NMOS transistor N7 is connected to VSS. The source of PMOS transistor P6 is connected to VDD.

Second latch 204 includes a second inverter 204b including an NMOS transistor N8 and a PMOS transistor P7. The gate of NMOS transistor N8 is connected to the drains of NMOS transistor N7 and PMOS transistor P6 of first inverter 204a. The gate of PMOS transistor P6 is configured to receive second output signal outn. The drains of NMOS transistor N8 and PMOS transistor P7 are connected to each other and to a third output node C. The source of NMOS transistor N8 is connected to VSS. The source of PMOS transistor P7 is connected to VDD.

Second latch 204 includes a third inverter 204c including an NMOS transistor N9 and a PMOS transistor P8. The gates of NMOS transistor N9 and PMOS transistor P8 are connected to the drains of NMOS transistor N8 and PMOS transistor P7 of second inverter 204b. The drains of NMOS transistor N9 and PMOS transistor P8 are connected to each other. The source of NMOS transistor N9 is connected to VSS. The source of PMOS transistor P8 is connected to VDD.

Second latch 204 includes a fourth inverter 204d including an NMOS transistor N10 and a PMOS transistor P9. The gates of NMOS transistor N10 and PMOS transistor P9 are connected to the drains of NMOS transistor N9 and PMOS transistor P8 of third inverter 204c. The drains of NMOS transistor N10 and PMOS transistor P9 are connected to each other. The source of NMOS transistor N10 is connected to VSS. The source of PMOS transistor P9 is connected to VDD. The drains of NMOS transistor N10 and PMOS transistor P9 are also connected to the gates of NMOS transistor N9 and PMOS transistor P8 of third inverter 204c as well as to the drains of NMOS transistor N8 and PMOS transistor P7 of second inverter 204b to provide a third output signal outq at third output node C. Third inverter 204c and fourth inverter 204d are configured to help maintain a constant voltage level at third output node C during the pre-charging period.

In some embodiments, third inverter 204c and fourth inverter 204d are omitted from second latch 204. In embodiments where third inverter 204c and fourth inverter 204d are omitted, third output signal outq is provided at third output node C from the drains of NMOS transistor N8 and PMOS transistor P7. Embodiments which include third inverter 204c and fourth inverter 204d provide faster symbol evaluation, whereas embodiments which omit the third and fourth inverters are less complex and easier to manufacture.

A third capacitor C3 is connected to third output signal outq. A first side of third capacitor C3 is connected to third output outq and a second side of the third capacitor is connected to VSS. During operation, third capacitor C3 is charged by third output signal outq.

Buffer 206 is configured to receive third output signal outq. Buffer 206 is an inverter including an NMOS transistor N11 and a PMOS transistor P10. The gates of NMOS transistor N11 and PMOS transistor P10 are configured to receive third output signal outq. The source of NMOS transistor N11 is connected to VSS. The source of PMOS transistor P10 is connected to VDD. The drains of NMOS transistor N11 and PMOS transistor P10 are connected to each other and provide an evaluation output signal outev.

A fourth capacitor C4 is configured to connect to evaluation output signal outev. A first side of fourth capacitor C4 is connected to final output signal outev and a second side of the fourth capacitor is connected to VSS. During operation, fourth capacitor C4 is charged by evaluation output signal outev.

Referring to FIG. 2B, a time period when first clock signal ckp2 is logically low is called a pre-charging period. During the pre-charging period, first pre-charging transistor P1 and second pre-charging transistor P2 are activated due to first clock signal ckp2 having a logically low voltage level. Terminal connecting transistor P5 is also activated due to first clock signal ckp2 having a logically low voltage level. As a result, first output signal outp and second output signal outn are pre-charged to a logically high value. First and second output signals outp and outn charge first and second capacitors C1 and C2, respectively. Logically high first and second output signals outp and outn activate first and second cross-latched transistors N5 and N6. First inverter 204a and second inverter 204b are configured to prevent the pre-charged first output outp and second output outn from being transferred to third output outq. Logically high first output outp activates NMOS transistor N7 which connects the gate of NMOS transistor N8 to VSS, which maintains NMOS transistor N8 in a non-active state. Logically high second output outn maintains PMOS transistor in a non-active state. Thus, third output outq is separated from first output outp and second output outn during the pre-charging period.

Figure 2C:
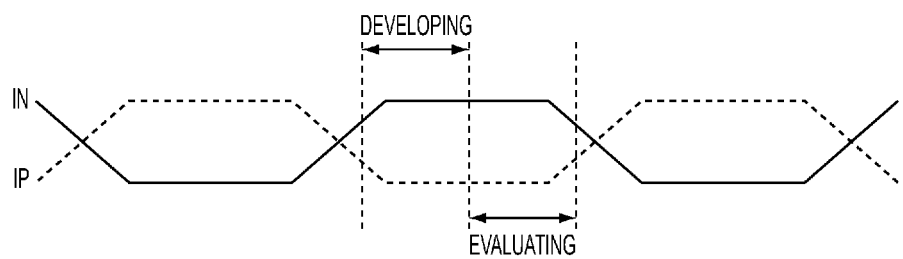
FIG. 2C is a waveform diagram of input signals in relation to clock signals for use in the slicer of FIG. 2A in accordance with one or more embodiments.

A time period when clock signal ckp2 is logically low and clock signal ckp2x is logically high is called a developing period. During the developing period, first pre-charging transistor P1 and second pre-charging transistor P2 remain active and connect outputs outp and outn to VDD. Also during the developing period, second clock signal ckp2x activates developing transistor N2 connecting the source of first and second input transistors N3 and N4 to VSS. FIG. 2C is a waveform diagram of input signals IN and IP in relation to clock signals ckp2 and ckp2x. In the depicted embodiment, input signal IN is at a high logical value during the developing period. Logically high input signal IN activates first input transistor N3, thereby connecting first output signal outp to VSS. By connecting first output outp to VSS, the voltage level of the first output signal is slightly decreased even though the first output signal is still connected to VDD. The lowered voltage level of first output signal outp reduces the charge held in first capacitor C1. In embodiments where input signal IP is logically high, second output signal outn is connected to VSS. In embodiments where VSS is a negative bias voltage, the developing period provides more reduction of the voltage level of the output connected to VSS, but power consumption is increased.

A time period when clock signal ckp2 is logically high is called an evaluating period. During the evaluating period, first and second pre-charging transistors P1 and P2 are deactivated. Terminal connecting transistor P5 is also deactivated. First clock signal ckp2 activates evaluating transistor N1 which connects the sources of first and second cross-latched transistors N5 and N6 to VSS. First and second cross-latched transistor N5 and N6 remain active due to the pre-charging of first and second outputs outp and outn to a logically high value. As a result, first and second output signals outp and outn are connected to VSS. In the depicted embodiment, first output signal outp has a lower voltage level due to connection to VSS during the developing period. First output signal outp is also connected to VSS through two current paths, i.e., through evaluating transistor N1 and through developing transistor N2, which causes the voltage level of first output signal outp to reach a logically low state more rapidly than second output signal outn. The charge in first capacitor C1 is also reduce faster than a charge in second capacitor C2 due to connecting first output signal outp to VSS. The lowered voltage level of first output signal outp also deactivates second cross-latched transistor N6 which disconnects second output signal outn from VSS, thereby preventing further decrease in the voltage level of the second output signal. In embodiments where VSS is a negative bias voltage, the voltage level of first output signal outp is reduced more rapidly to provide quicker differentiation between the first output signal and second output signal outn than embodiments where VSS has is a ground or a positive bias voltage; however, power consumption is increased.

In the depicted embodiment, second latch 204 generates a logically low third output signal outq. Logically low first output signal outp activates PMOS transistor P6 thereby connecting the gate of NMOS transistor N8 to VDD and activating NMOS transistor N8. Activated NMOS transistor N8 connects third output signal outq to VSS thereby draining charge in third capacitor C3. Third and fourth inverters 204c and 204d amplify the logically low third output signal outq by providing a second current path connecting the third output signal to VSS.

The amplified third output signal outq activates PMOS transistor P10 of buffer 206 which connects evaluation output outev to VDD. In embodiments which include third and fourth inverters 204c and 204d, a voltage level of third output signal outq is amplified which activates PMOS transistor P10 more quickly than embodiments where the third and fourth inverters are omitted.

The use of developing transistor N2 and second clock signal ckp2x facilitates more rapid identification of input signals IN and IP the other approaches by slightly lowering the voltage level of one of the first output outp or second output outn during the developing phase and providing a second current path connecting one of the first or second output to VSS during an initial period of the evaluating period. In some embodiments, slicer 200 identifies the symbol of input signal IN and IP within about 20 ps to about 25 ps. In comparison with an identification time of about 75 ps in other approaches, slicer 200 enables identification at least three times faster. The faster identification time allows for higher frequency signals in comparison with the conventional art. In some embodiments, slicer 200 is capable of identifying symbols in a signal having a frequency up to about 25 GHz.

Further, the inclusion of the developing period facilitates the ability of slicer 200 to recognize small differences between input signals IN and IP. The developing period provides slicer 200 an additional time period to reduce the voltage level at one of the first or second output node, which enables the circuitry of slicer 200 to recognize a difference between the voltage levels at first and second output nodes before input signals IN and IP change. In some embodiments, slicer 200 is capable of recognizing a difference between input signals IN and IP of 30 millivolts (mV) or less. In some embodiments, slicer 200 is capable of recognizing a difference between input signals IN and IP of 10 mV or less. The ability to recognize small differences between input signals enables slicer 200 to precisely identify each symbol in the signal without omitting symbols which have a high level of degradation.

Figure 3A:
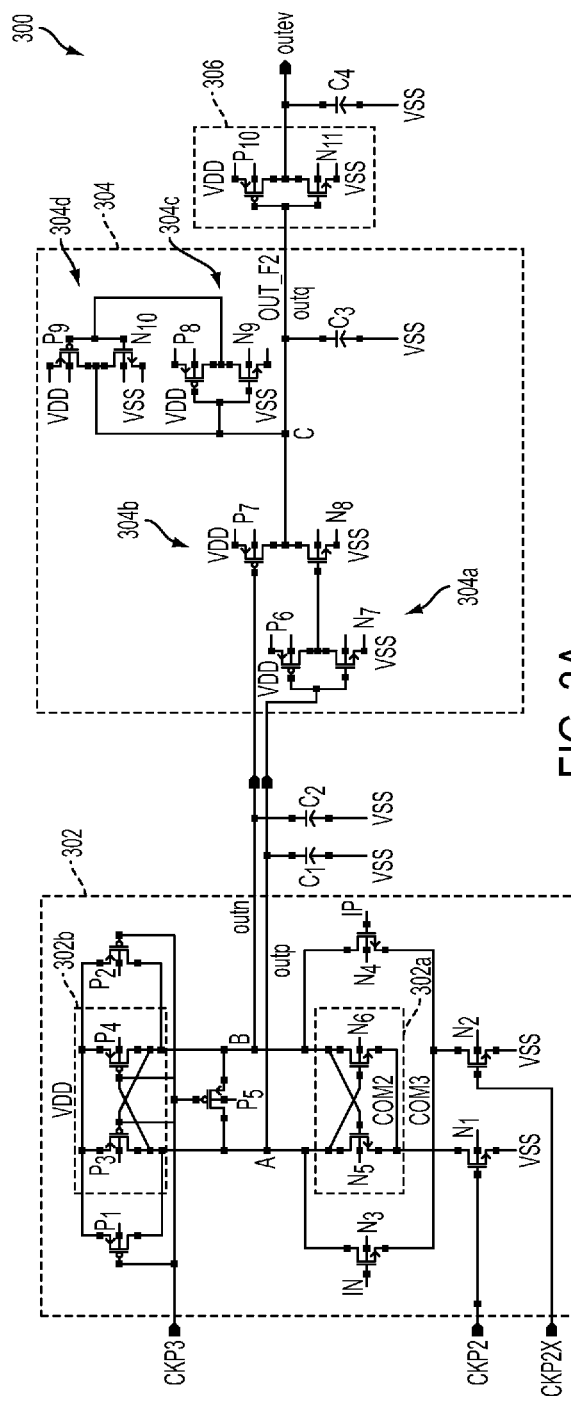
FIG. 3A is a schematic diagram of a slicer in accordance with one or more embodiments.

FIG. 3A is a schematic diagram of a slicer 300 according to at least one embodiment. Slicer 300 includes a first latch 302 configured to receive two input signals IN and IP. Slicer 300 further includes a second latch 304 configured to prevent improper identification of a symbol during a pre-charge phase of first latch 302. Slicer 300 further includes a buffer 306 configured to output an evaluation of the symbol. Reference numbers of like elements in FIG. 3A are the same as reference numbers in FIG. 2A increased by 100.

Figure 3B:
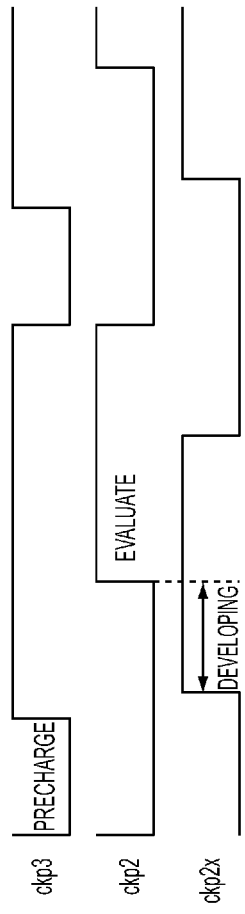
FIG. 3B is a waveform diagram of clock signals for use in the slicer of FIG. 3A in accordance with one or more embodiments.

First latch 302 is configured to receive first clock signal ckp2, second clock signal ckp2x and a third clock signal ckp3. FIG. 3B is a waveform diagram of clock signals ckp2, ckp2x and ckp3 for slicer 300. First clock signal ckp2 has a same period as second clock signal ckp2x. First clock signal ckp2 is delayed with respect to second clock signal ckp2x by a predetermined time period such that the first and second clock signals overlap with one another. In some embodiments, the predetermined time period is about 5 picoseconds (ps) to about 25 ps. Third clock signal ckp3 has a different period than first and second clock signals ckp2 and ckp2x. A logically low portion of third clock signal ckp3 does not overlap with a logically high portion of first clock signal ckp2 or second clock signal ckp2x. A logically high portion of third clock signal ckp3 overlaps with an entire duration of a logically high portion of first clock signal ckp2 and second clock signal ckp2x.

First latch 302 is similar to first latch 202 except that the gates of first pre-charging transistor P1, second pre-charging transistor P2 and terminal connecting transistor P5 are configured to receive third clock signal ckp3 instead of first clock signal ckp2.

Referring to FIG. 3B, a time period when third clock signal ckp3 is logically low is called a pre-charging period. During the pre-charging period, first pre-charging transistor P1 and second pre-charging transistor P2 are activated due to third clock signal ckp3 having a logically low voltage level. Terminal connecting transistor P5 is also activated due to third clock signal ckp3 having a logically low voltage level. As a result, first output signal outp and second output signal outn are pre-charged to a logically high value. First and second output signals outp and outn charge first and second capacitors C1 and C2, respectively. Second latch 304 is configured to prevent first and second output signals outp and outn from impacting third output signal outq in the same manner as discussed above with respect to slicer 200.

Following the pre-charging period, third clock signal ckp3 transitions to a logically high value. As a result, first pre-charging transistor P1, second pre-charging transistor P2 and terminal connecting transistor P5 are deactivated.

Figure 3C:
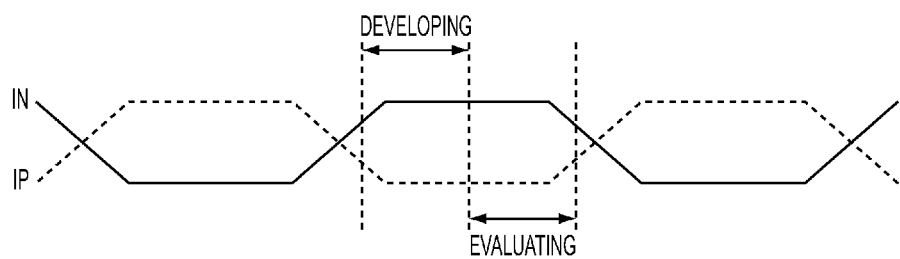
FIG. 3C is a waveform diagram of input signals in relation to clock signals for use in the slicer of FIG. 3A in accordance with one or more embodiments.

A time period when first clock signal ckp2 is logically low, second clock signal ckp2x is logically high and third clock signal is logically high is called a developing period. During the developing period, second clock signal ckp2x activates developing transistor N2 connecting the source of first and second input transistors N3 and N4 to VSS. FIG. 3C is a waveform diagram of input signals IN and IP in relation to first and second clock signals ckp2 and ckp2x. In the depicted embodiment, input signal IN is at a high logical value during the developing period. Logically high input signal IN activates first input transistor N3, thereby connecting first output signal outp to VSS. By connecting first output signal outp to VSS, the voltage level on of the first output signal is decreased. The lowered voltage level of first output signal outp reduces the charge held in first capacitor C1. In comparison with slicer 200, slicer 300 reduces the voltage level of first output signal outp more significantly because the first output signal is not connected to VDD during the developing period. As a result, a time required for identifying the symbol is decreased for slicer 300 in comparison with slicer 200.

A time period when clock signal ckp2 is logically high is called an evaluating period. First clock signal ckp2 activates evaluating transistor N1 which connects the sources of first and second cross-latched transistors N5 and N6 to VSS. First and second cross-latched transistor N5 and N6 remain active due to the pre-charging of first and second output signals outp and outn to a logically high value. As a result, first and second output signals outp and outn are connected to VSS. In the depicted embodiment, first output signal outp has a lower voltage level due to connection to VSS during the developing period. First output signal outp is also connected to VSS through two current paths, i.e., through evaluating transistor N1 and though developing transistor N2, which causes the voltage level of first output signal outp to reach a logically low state more rapidly than second output signal outn. The charge in first capacitor C1 is also reduce faster than a charge in second capacitor C2 due to connecting first output signal outp to VSS. The lowered voltage level of first output signal outp also deactivates second cross-latched transistor N6 which disconnects second output signal outn from VSS, thereby preventing further decrease in the voltage level of the second output signal.

In the depicted embodiment, second latch 304 will operate in a manner similar to second latch 204.

In addition to the use of developing transistor N2 and second clock signal ckp2x to facilitate more rapid identification of input signals IN and IP, slicer 300 also includes third clock signal ckp3 to determine the pre-charging period. The first output signal outp is lowered to a greater degree in slicer 300 than in slicer 200 because the first output is not connected to VDD during the developing period. The result is a more rapid identification of the symbol of input signals IN and IP. In some embodiments, slicer 300 identifies the symbol of input signals IN and IP within about 15 ps to about 19 ps. In comparison with an identification time of about 75 ps in the other approaches, and about 20 ps to about 25 ps in slicer 200. The faster identification time allows for higher frequency signals in comparison with the other approaches. In addition slicer 300 consumes less power than slicer 200 because first and second output signals outp and outn are not connected to both VDD and VSS during the developing period.

Figure 4:
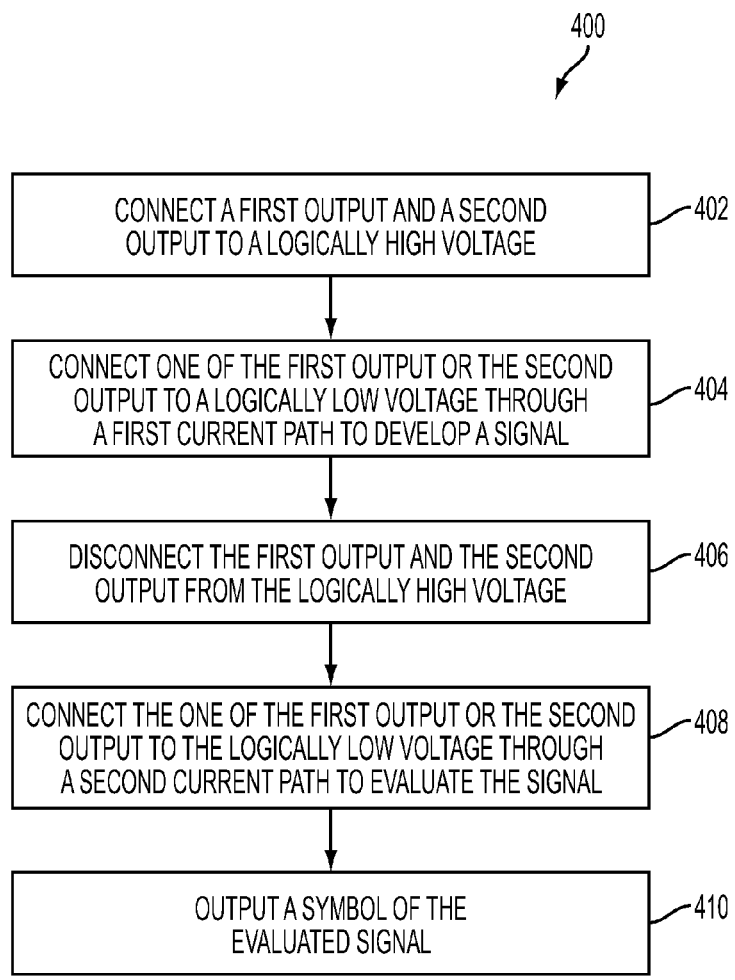
FIG. 4 is a flow chart of a method of using a slicer circuit in accordance with one or more embodiments.

FIG. 4 is a flowchart of a method 400 of using a slicer according to at least one embodiment. Method 400 begins with step 402 in which a first output node and a second output node are connected to a logically high voltage. In slicer 200, first output node A and second output node B are connected to VDD during a logically low level of first clock signal ckp2. In slicer 300, first output node A and the second output node B are connected to VDD during a logically low level of third clock signal ckp3.

In step 404, one of the first output node or the second output node is connected to a logically low voltage through a first current path to develop a signal. In slicer 200 and slicer 300, developing transistor N2 is activated by a high logic state of second clock signal ckp2x. One of first output node A or second output node B is connected to VSS based on input signals IN and IP. In slicer 200 and slicer 300, the first current path passes through developing transistor N2.

In step 406, the first output node and the second output node are disconnected form the logically high voltage. In slicer 200, first output node A and second output node B are disconnected from VDD during a logically high state of first clock signal ckp2. In slicer 300, step 406 occurs prior to step 404. In slicer 300, first output node A and second output node B are disconnected from VDD during a logically high state of third clock signal ckp3.

In step 408, the one of the first output node or the second output node is connected to the logically low voltage through a second current path to evaluate the signal. In slicer 200 and slicer 300, evaluating transistor N1 is activated by a high logic state of first clock signal ckp2. The one of first output node A or second output node B is connected to VSS based on input signals IN and IP. In slicer 200 and slicer 300, the second current path passes through evaluating transistor N1.

In step 410, a symbol of the evaluated signal is output. In slicer 200, the symbol is output by buffer 206. In slicer 300, the symbol is output by buffer 306.

One aspect of the present description relates to a slicer. The slicer includes a first latch. The first latch includes an evaluating transistor configured to receive a first clock signal, the evaluating transistor connected to a first voltage source. The first latch further includes a developing transistor configured to receiving a second clock signal, the developing transistor connected to the first voltage, wherein the first clock signal is different from the second clock signal. The first latch further includes a first input transistor configured to receive a first input. The first latch further includes a second input transistor configured to receive a second input, wherein the first and second inputs are complementary signals and the first and second input transistors are connected to the developing transistor. The first latch further includes at least one pre-charging transistor configured to receive a third clock signal, the at least one pre-charging transistor connected to a second voltage source higher than the first voltage source, wherein the at least one pre-charging transistor is connected to a first output node and a second output node. The first latch further includes at least one cross-latched pair of transistors, the at least one cross-latched transistor pair connected between the evaluating transistor and the first and second output nodes. The slicer further includes a second latch connected to the first and second output nodes and to a third output node. The slicer further includes a buffer connected to the third output node and configured to generate an evaluation output signal.

Another aspect of the present description relates to a signal transmission system. The signal transmission system includes a pattern generator configured to generate a signal. The signal transmission system further includes a decision feedback equalizer configured to receive the signal. The decision feedback equalizer includes a slicer. The slicer includes a first latch. The first latch includes an evaluating transistor configured to receive a first clock signal, the evaluating transistor connected to a first voltage source. The first latch further includes a developing transistor configured to receiving a second clock signal, the developing transistor connected to the first voltage, wherein the first clock signal is different from the second clock signal. The first latch further includes a first input transistor configured to receive a first input. The first latch further includes a second input transistor configured to receive a second input, wherein the first and second inputs are complementary signals and the first and second input transistors are connected to the developing transistor. The first latch further includes at least one pre-charging transistor configured to receive a third clock signal, the at least one pre-charging transistor connected to a second voltage source higher than the first voltage source, wherein the at least one pre-charging transistor is connected to a first output node and a second output node. The first latch further includes at least one cross-latched pair of transistors, the at least one cross-latched transistor pair connected between the evaluating transistor and the first and second outputs. The slicer further includes a second latch connected to the first and second output nodes and to a third output node. The slicer further includes a buffer connected to the third output node and configured to generate an evaluation output signal.

Another aspect of the present description relates to a method of using a slicer. The method includes connecting a first output node and a second output node to a first voltage source. The method further includes connecting one of the first output node or the second output node to a second voltage source through a first current path, the second voltage source being lower than the first voltage source. The method further includes disconnecting the first output node and the second output node from the first voltage source. The method further includes connecting the one of the first output node or the second output node to the second voltage source through a second current path different from the first current path. The method further includes outputting a symbol based on a voltage level of the first output node and a voltage level of the second output node.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A slicer comprising:
a first latch, the first latch comprising:
an evaluating transistor configured to receive a first clock signal, the evaluating transistor connectable to a first voltage source;
a developing transistor configured to receive a second clock signal, the developing transistor connectable to the first voltage source, wherein the first clock signal is different from the second clock signal;
a first input transistor configured to receive a first input;
a second input transistor configured to receive a second input, wherein the first and second inputs are complementary signals and the first and second input transistors are connected with the developing transistor;
at least one pre-charging transistor configured to receive a third clock signal, the at least one pre-charging transistor connectable to a second voltage source having a voltage level greater than the first voltage source, wherein the at least one pre-charging transistor is connected to a first output node and a second output node; and
at least one cross-latched pair of transistors, the at least one cross-latched transistor pair connected between the evaluating transistor and the first and second output nodes;
a second latch connected to the first and second output nodes and to a third output node; and
a buffer connected to the third output node and configured to generate an evaluation output signal.

2. The slicer of claim 1, wherein the first clock signal and the third clock signal are the same.

3. The slicer of claim 1, wherein the first clock signal and the third clock signal are different.

4. The slicer of claim 3, wherein a logically low state of the third clock signal does not overlap with a logically high state of the second clock signal.

5. The slicer of claim 1, wherein a logically high state of the first clock signal and a logically high state of the second clock signal overlap.

6. The slicer of claim 1, wherein the second latch comprises:
a first inverter connected to the first output node and configured to generate a first inverter output signal; and
a second inverter comprising a p-type metal-oxide-semiconductor (PMOS) transistor connected to the second output node and an n-type metal-oxide-semiconductor (NMOS) transistor is configured to receive the first inverter output signal, and the second inverter is connected to the third output node and configured to generate a second inverter output signal.

7. The slicer of claim 6, wherein the second latch further comprises:
a third inverter connected to the third output node and configured to generate a third inverter output signal; and
a fourth inverter configured to receive the third inverter output signal and to amplify a voltage level at the third output node.

8. The slicer of claim 1, wherein the buffer is an inverter.

9. A signal transmission system comprising:
a pattern generator configured to generate a signal; and
a decision feedback equalizer configured to receive the signal comprising a slicer, the slicer comprising:
a first latch, the first latch comprising:
an evaluating transistor configured to receive a first clock signal, the evaluating transistor connectable to a first voltage source;
a developing transistor configured to receive a second clock signal, the developing transistor connectable to the first voltage source, wherein the first clock signal is different from the second clock signal;
a first input transistor configured to receive a first input;
a second input transistor configured to receive a second input, wherein the first and second inputs are complementary signals and the first and second input transistors are connected with the developing transistor;
at least one pre-charging transistor configured to receive a third clock signal, the at least one pre-charging transistor connectable to a second voltage source having a voltage level greater than the first voltage source, wherein the at least one pre-charging transistor is connected to a first output node and a second output node; and
at least one cross-latched pair of transistors, the at least one cross-latched transistor pair connected between the evaluating transistor and the first and second output nodes;
a second latch connected to the first and second output nodes and to a third output node; and
a buffer connected to the third output node and configured to generate an evaluation output signal.

10. The signal transmission system of claim 9, wherein the first clock signal and the third clock signal are the same.

11. The signal transmission system of claim 9, wherein the first clock signal and the third clock signal are different.

12. The signal transmission system of claim 11, wherein a logically low state of the third clock signal does not overlap with a logically high state of the second clock signal.

13. The signal transmission system of claim 9, wherein the first clock signal and the second clock signal overlap.

14. The signal transmission system of claim 9, wherein the second latch comprises:
a first inverter is connected to the first output node and to generate a first inverter output signal;
a second inverter, wherein a p-type metal-oxide-semiconductor (PMOS) transistor of the second inverter is connected to the second output node and an n-type metaloxide-semiconductor (NMOS) transistor of the second inverter is configured to receive the first inverter output signal and, the second inverter configured to generate a second inverter output signal at the third output node;

a third inverter configured to receive the second inverter output signal and to generate a third inverter output signal; and a fourth inverter configured to receive the third inverter output signal and to amplify the second inverter output signal at the third output node.

15. A method of using a slicer, the method comprising:

connecting a first output node and a second output node to a first voltage source;

connecting one of the first output node or the second output node to a second voltage source through a first current path using a second clock signal, the second voltage source having a lower voltage level than the first voltage source;

disconnecting the first output node and the second output node from the first voltage source;

connecting the one of the first output node or the second output node to the second voltage source through a second current path different from the first current path using a first clock signal different from the second clock signal; and outputting a symbol based on a voltage level at the first output node and a voltage level at the second output node.

16. The method of claim 15, wherein disconnecting the first output node and the second output node from the first voltage source occurs prior to connecting one of the first output node or the second output node to the second voltage source through the first current path.

17. The method of claim 15, wherein disconnecting the first output node and the second output node from the first voltage source occurs subsequent to connecting one of the first output node or the second output node to the second voltage source through the first current path.

18. The method of claim 15, wherein the one of the first output node or the second output node is connected to the second voltage source based on complementary input signals.

19. The method of claim 15, wherein the disconnecting the first output node and the second output node from the first voltage source and the connecting the one of the first output node or the second output node to the second voltage source through the second current path occur simultaneously.

20. The method of claim 15, wherein the first clock signal is delayed relative to the second clock signal by about 5 picoseconds (ps) to about 20 ps.

* * * * *